(12) United States Patent
Aas et al.

(10) Patent No.: US 8,344,817 B2
(45) Date of Patent: Jan. 1, 2013

(54) COMPENSATING DFLL WITH ERROR AVERAGING

(75) Inventors: Arne Aas, Trondheim (NO); Andreas Onsum, Trondheim (NO)

(73) Assignee: Atmel Corporation, San Jose, CA (US)

( * ) Notice: Subject to any disclaimer, the term of this patent is extended or adjusted under 35 U.S.C. 154(b) by 161 days.

(21) Appl. No.: 12/976,886

(22) Filed: Dec. 22, 2010

(65) Prior Publication Data

US 2012/0161826 A1    Jun. 28, 2012

(51) Int. Cl.
*H03L 1/00* (2006.01)
(52) U.S. Cl. .............. 331/176; 331/175; 331/177 R
(58) Field of Classification Search .......... 331/1 A, 331/2, 18, 175, 176, 177 R
See application file for complete search history.

(56) References Cited

U.S. PATENT DOCUMENTS

| | | | |
|---|---|---|---|
| 4,325,036 A * | 4/1982 | Kuwabara .................. 331/176 |
| 6,788,159 B2 * | 9/2004 | Takahashi et al. ........... 331/176 |
| 7,579,919 B1 * | 8/2009 | Cao ........................... 331/176 |
| 7,830,216 B1 * | 11/2010 | Seth et al. ................. 331/177 R |
| 2004/0232995 A1 * | 11/2004 | Thomsen et al. ............. 331/2 |
| 2007/0249293 A1 * | 10/2007 | Chae et al. .................. 455/76 |
| 2008/0164952 A1 * | 7/2008 | Babitch ....................... 331/66 |
| 2008/0164953 A1 * | 7/2008 | Partridge et al. ............. 331/66 |
| 2011/0187462 A1 * | 8/2011 | Sonntag ...................... 331/34 |

* cited by examiner

*Primary Examiner* — Joseph Chang
*Assistant Examiner* — Jeffrey Shin
(74) *Attorney, Agent, or Firm* — Fish & Richardson P.C.

(57) ABSTRACT

A compensating DFLL (CDFLL) is disclosed that utilizes temperature readings at regular intervals in combination with production characterization data of a reference oscillator to compensate for frequency drift and nominal frequency error. In some implementations, the CDFLL selects a calibration value that is not optimal for frequency accuracy to minimize accumulated frequency error over time. More particularly, during a calibration run, mismatch between an ideal frequency and an actual frequency is measured, and the measurement is used as a starting point for a next calibration run, such that the accumulated frequency error is averaged almost to zero over time.

9 Claims, 6 Drawing Sheets

US 8,344,817 B2

COMPENSATING DFLL WITH ERROR AVERAGING

TECHNICAL FIELD

This subject matter is generally related to electronics, and more particularly to digital frequency locked loop circuits.

BACKGROUND

When designing oscillators, tradeoffs are often made between area, power consumption and accuracy. Accuracy can be affected by the absolute calibrated accuracy at the time of calibration and by frequency drift due to temperature and voltage variation. High accuracy oscillators are available. Such devices, however, use a high amount of power and have a production cost. Additionally, such high accuracy oscillators are vulnerable to frequency drift due to assumptions about initial characterization made during production calibration.

A digital frequency locked loop (DFLL) combined with an accurate reference oscillator and a calibrateable, low power oscillator can overcome the power consumption issue because the reference oscillator need only be turned on at regular intervals. A DFLL tries to maintain a certain frequency of a target oscillator based on a reference oscillator to minimize the instantaneous frequency error of the target oscillator. A limiting factor, however, is the calibration step size of the target oscillator, which can cause frequency error even when the DFLL operates correctly. Additionally, a DFLL combined with an accurate reference oscillator does not address frequency drift due to temperature and voltage variation, or assumptions about initial device characterization made during production calibration.

SUMMARY

A compensating DFLL (CDFLL) is disclosed that utilizes temperature readings at regular intervals in combination with characterization data to compensate for frequency drift and nominal frequency error. In some implementations, the CDFLL selects a calibration value that is not optimal for frequency accuracy to minimize accumulated frequency error over time. During a calibration event, mismatch between an ideal frequency and an actual frequency is measured, and the measurement is used as a starting point for a next calibration event, such that the accumulated frequency error is averaged almost to zero over time.

Particular implementations of the invention can be implemented to realize one or more of the following advantages: 1) the CDFLL compensates for nominal frequency and drift errors, resulting in reduced complexity, less area and power consumption and increased accuracy; 2) the CDFLL test time is reduced because the frequency is measured and compensated by the CDFLL during runtime; and 3) the CDFLL averages accumulated frequency error to almost zero over time.

DETAILED DESCRIPTION

Exemplary CDFL System

Figure 1:
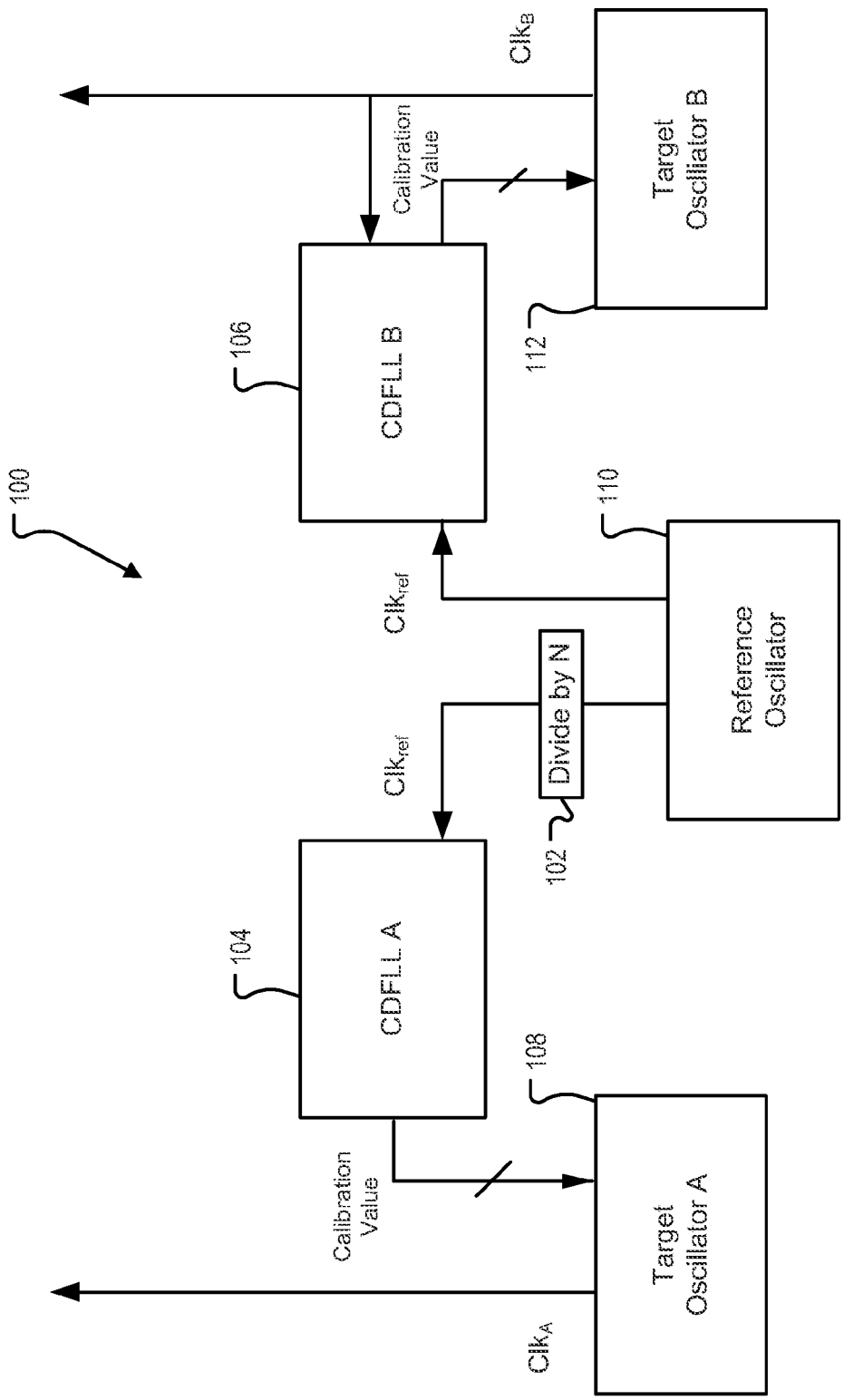
FIG. 1 is a block diagram of an exemplary CDFLL system.

FIG. 1 is a block diagram of an exemplary CDFLL system 100. CDFLL system 100 can be implemented in, for example, a clock system of a microcontroller or any other integrated circuit device that uses an oscillator that could benefit from automatic calibration. In some implementations, CDFLL system 100 can include divide by N counter 102, CDFLL 104, CDFLL 106, target oscillator 108, reference oscillator 110 and target oscillator 112.

Reference oscillator 110 (e.g., 128 KHz) provides a reference clock to CDFLL 104 and CDFLL 106. CDFLL 104 is coupled to target oscillator 108 and provides calibration values to target oscillator 108. CDFLL 106 is coupled to target oscillator 112 and provides calibration values to target oscillator 112. In some implementations, target oscillator 108 can be a low power oscillator (e.g., 128 kHz) and target oscillator 112 can be a fast system oscillator (e.g., 7.2 MHz). The behavior of reference oscillator 110 is known due to characterization of reference oscillator 110 during production calibration. Divide-by-N counter 102 can be used to divide down a clock from reference oscillator 110 to ensure that the reference frequency provided to CDFLL 104 is lower than the target frequency of target oscillator 108. In this example configuration, CDFLL 106 does not need divide-by-N counter 102 since the target frequency of target oscillator 112 is higher than the reference frequency (e.g., 7.2 MHz versus 128 KHz).

In some implementations, CDFLL 104 and CDFLL 106 can utilize an analog-to-digital converter (ADC) in combination with characterization data for reference oscillator 110 to compensate for frequency drift and nominal frequency error of reference oscillator 110. At regular intervals, an ADC temperature reading can be taken and used by CDFLL 104 or CDFLL 106 to compensate for frequency drift and nominal frequency error of reference oscillator 110. CDFLL 104 or CDFLL 106 can use raw temperature readings provided by the ADC with a base-frequency value (oscillator frequency without scaling) and a temperature coefficient. The values of the base-frequency and the temperature coefficient can be calculated during production testing of module 100. Alternatively, the temperature coefficient can be calculated during characterization of CDFLL system 100.

For some applications, a high accuracy oscillator may be needed in a limited temperature range. In those applications, a single set of calibration values may be sufficient. Other applications, however, may need a more accurate oscillator that operates over a wider temperature range. These applications can divide the operating temperature range into a number of temperature range segments and provide a set of calibration values for each temperature range segment.

CDFLL system 100 described above can be used in other systems to compensate for temperature drift, such as a phase locked loop (PLL) system. In a PLL system, the division factor can be changed to compensate for the temperature drift in the reference oscillator.

Figure 2:
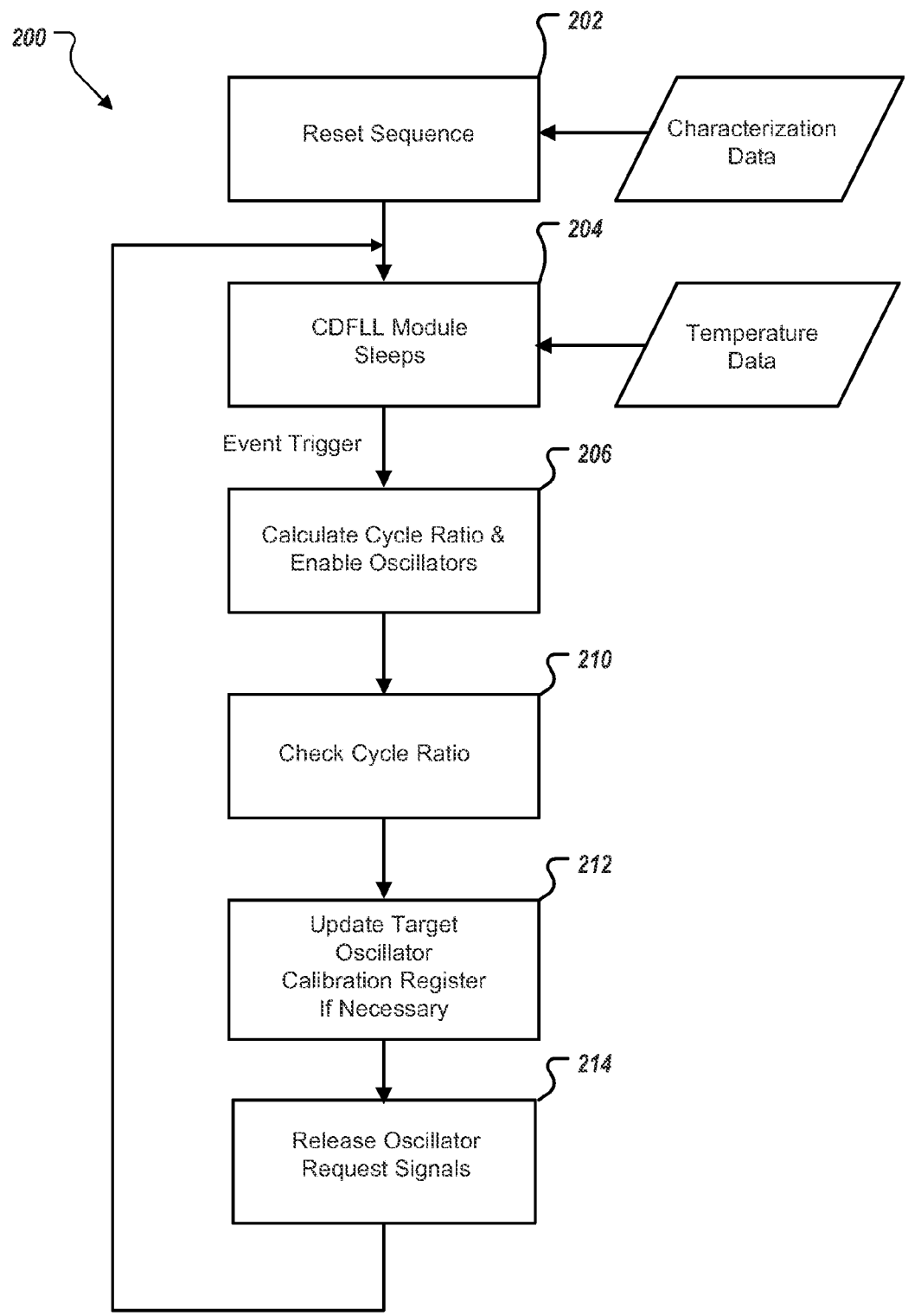
FIG. 2 is a flow diagram of an exemplary operation of the CDFLL system.

FIG. 2 is a flow diagram of an exemplary operation 200 of a CDFLL module of an integrated circuit chip (e.g., a microcontroller). In some implementations, operation 200 can begin upon initiation of a reset sequence when characterization data is loaded into the CDFLL system (202). The CDFLL module enters sleep mode until awakened by oscillator request signals from a central time keeper or other event trigger (204). In some implementations, the CDFLL module is awakened at regular intervals by a central time keeper. Upon awakening, the CDFLL module calculates cycle ratios for the target oscillators and enables the target oscillators (206). In some implementations, the cycle ratios represent fixed ideal relationships between the reference oscillator clock and the target oscillators. The cycle ratios can be calculated using the last ADC temperature reading and the characterization data. The characterization data can include a base period value (hereinafter also referred to as "Base") and a temperature coefficient (hereinafter also referred to as "a").

The CDFLL module wakes the reference oscillator, waits until it has stabilized and checks the cycle ratios for each target oscillator (208). A cycle ratio can be checked by counting the number of target oscillator clock cycles, and for each edge of the prescaled or not prescaled reference oscillator clock, comparing the count to the cycle ratio. Based on results of the comparison, a determination is made as to whether the target oscillator clock is running too fast or too slow. Based on this determination, calibration registers for the target oscillators are updated, if necessary (210). After a single check of the cycle ratios, the oscillator request signals are released (212) and the CDFLL module returns to sleep mode (204).

Figure 3:
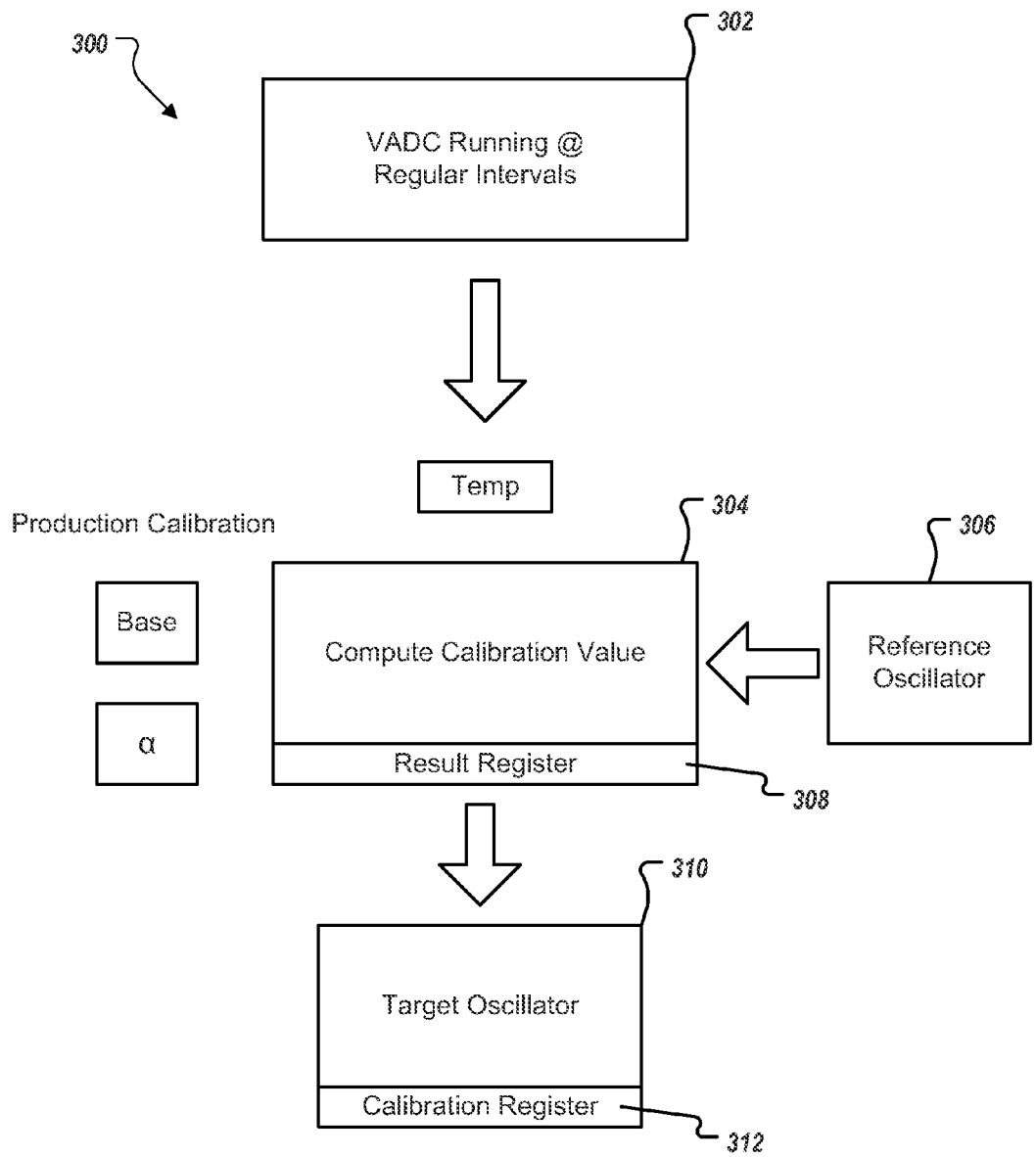
FIG. 3 is a block diagram illustrating a CDFLL module for an integrated circuit.

FIG. 3 is a block diagram of an exemplary CDFLL module 300 for an integrated circuit. In some implementations, module 300 can include a voltage ADC 302 (VADC), reference oscillator 306, target oscillator 310 and finite state machine (FSM) 304.

During calibration, VADC 302 takes temperature readings (hereinafter also referred to as "Temp") at regular intervals and FSM 304 computes calibration values based on the temperature readings. In some implementations, FSM 304 calculates a corrected count for a period of the reference oscillator clock (hereinafter also referred to as "Count") using the last VADC temperature reading Temp and characterization data Base and a as follows:

$$\text{Count} = \text{Base} \pm (\text{Temp} * \alpha). \quad [1]$$

Base and $\alpha$ can be calculated during production testing, and $\alpha$ can also be calculated during characterization of the reference and target oscillators. The value Base can be the number of reference clock cycles needed for correct calibration of a target oscillator at a theoretical temperature where the VADC temperature reading Temp is zero. The value $\alpha$ can be derivative of change in count cycles with respect to temperature based on a piecewise linear curve of frequency versus temperature for the target oscillator. More than one set of Base and $\alpha$ can be used, if needed, to compensate (possibly with other factors) in different temperature ranges. The corrected count can be stored in a data register.

CDFLL module checks a cycle ratio between target oscillator 310 and reference oscillator 306 by counting the number of clock cycles of the target oscillator clock, and for each edge of the prescaled or not prescaled reference oscillator clock, comparing the count to the corrected count stored in the data register. Based on results of the comparison, the calibration value stored in calibration register 312 of target oscillator 310 is updated, if necessary. For example, the calibration value can be decremented or incremented by a calibration step size depending on whether target oscillator 310 is running too fast or too slow, resulting in a slight adjustment to the frequency of target oscillator 310. Adjustments can be made for every calibration cycle.

Figure 4:
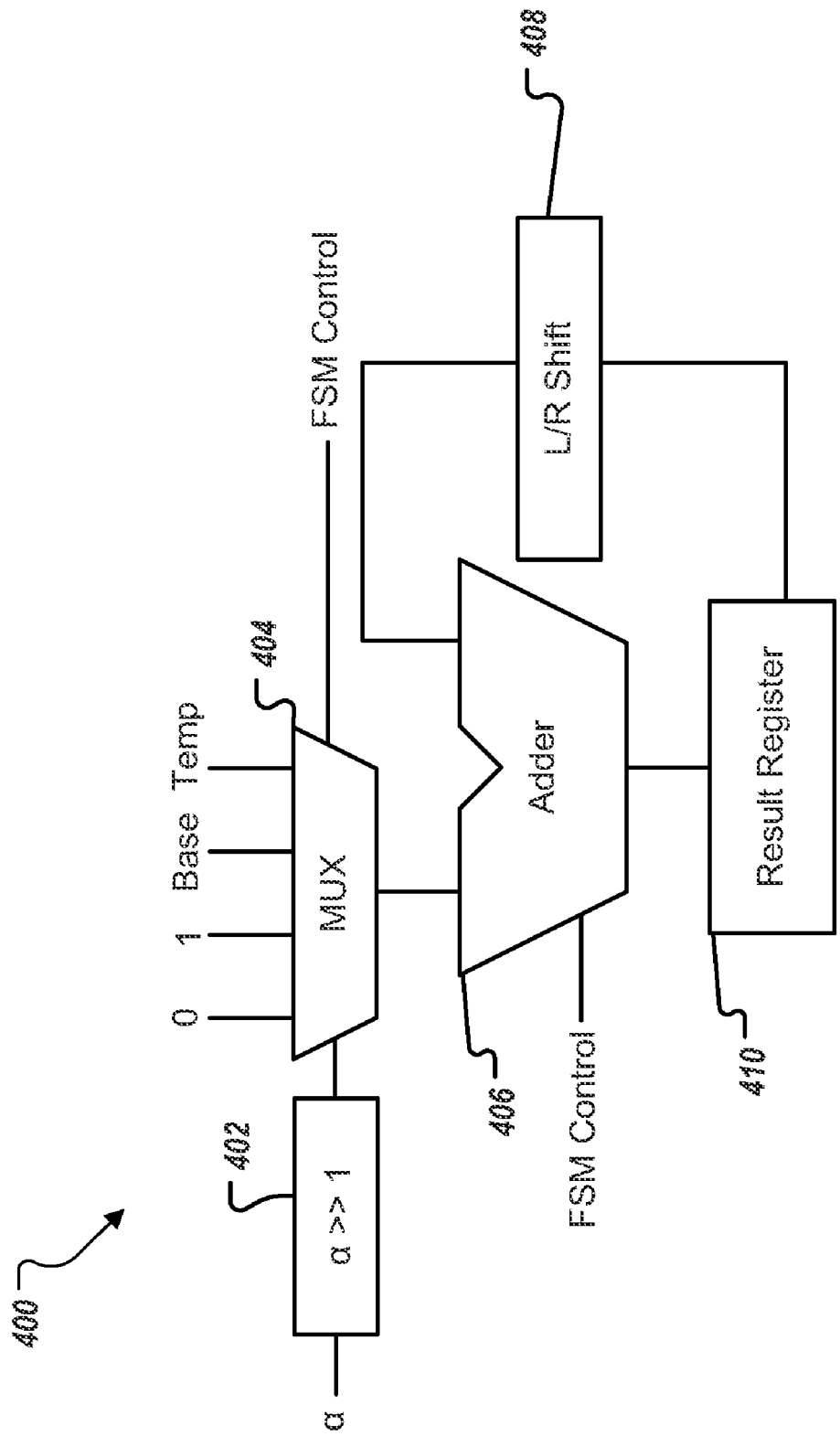
FIG. 4 is a block diagram of exemplary count computation logic.

FIG. 4 is a block diagram of exemplary count computation logic 400. In some implementations, count computation logic 400 can include shift register 402, multiplexer 404, adder 406 and result register 408. Result register 408 can also be a shift register. Computation logic 400 can perform the multiplication (Temp*$\alpha$) in Equation [1] using add and shift operations to reduce area overhead. In some implementations, computation logic 400 can be part of an arithmetic logic unit (ALU) which can be controlled by a finite state machine (FSM) implemented in logic or a controller.

When a new temperature reading is registered, result register 410 is cleared. The value $\alpha$ is loaded in shift register 402 and based on least significant bit (LSB) of $\alpha$ either the Temp value or 0 is added to the result R which has been shifted one bit position to the left. In the same cycle, the value $\alpha$ is shifted one bit position to the right so a new LSB is ready for the next addition.

This sequence is repeated n−1 times, where n is the number of bits that represents the value $\alpha$ as a number between 1 and 0 and a sign bit. On the next cycle, the result R is shifted to the right i−1 times and subtracted (or added depending on a LSB) from the Base value. Result register 410 now holds the corrected count which is compared against the count of the target oscillator. Based upon results of the comparison, the calibration value in calibration register 310 is updated (if necessary), and result register 410 is cleared to be ready for other calculations. The calibration value can be a binary number (e.g., 8-bit binary number) which can be used by the target oscillator to slightly adjust frequency up or down by a calibration step size. For example, if the target oscillator runs too fast or too slow the contents of the calibration register will be decremented or incremented by one to adjust the target oscillator frequency slightly.

The foregoing operations can be summarized by the following example pseudo code:

Clear R;
$R_i = (R_{i-1} << 1)$ (if $\alpha[0]=1$ then Temp else 0), $\alpha >> 1$;
$R_i = (R_{i-1} >> i-1)$;
$R_i = $ if $\alpha[0]=1$ then $-\text{Base} - R_{i-1}$ else $\text{Base} + R_{i-1}$;
$R_i = +1$.

Exemplary Averaging of Frequency Error

Figure 5A:
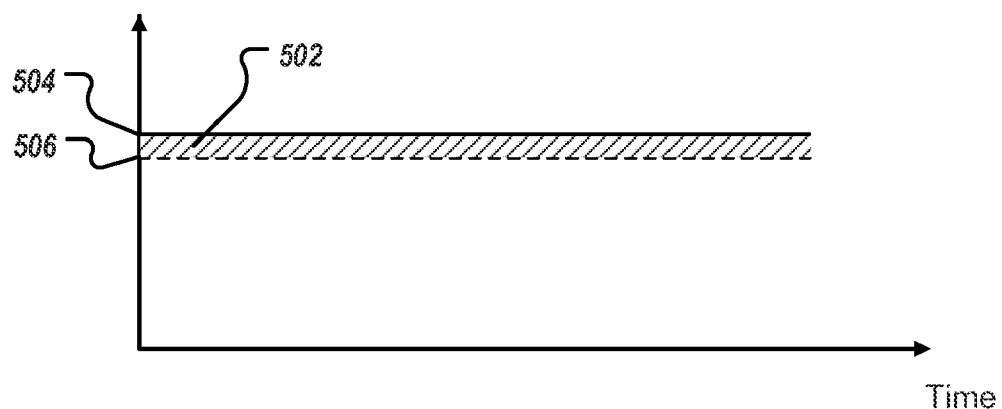
FIGS. 5A and 5B are graphs illustrating an exemplary process of averaging accumulated frequency error to almost zero.
Figure 5B:
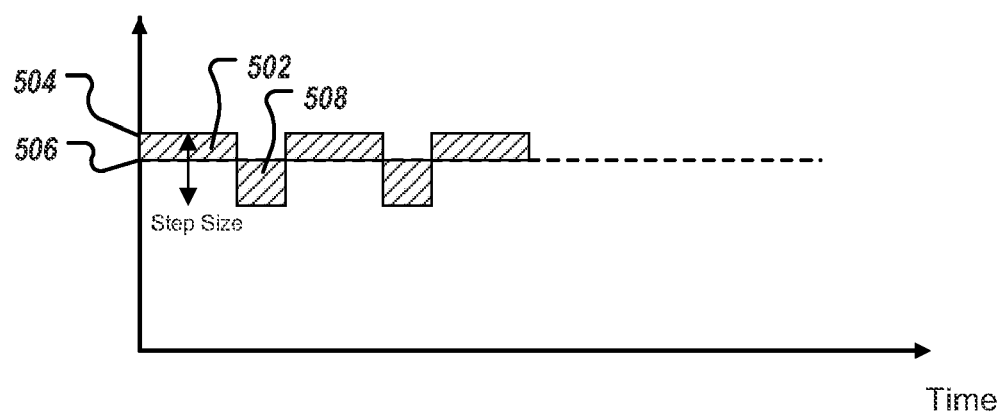

FIGS. 5A and 5B are graphs illustrating an exemplary process of averaging frequency error over time. The process can be implemented by a DFLL, such as the CDFLL previously described. For purposes of discussion, the process will be described with reference to CDFLL module 300 of FIG. 3.

For some applications, CDFLL module 300 tries to minimize the frequency error of target oscillator 310 at any given time (the instantaneous frequency error). This is accomplished by calibrating target oscillator 310 to a setting that gives the smallest mismatch between the ideal or target frequency and the actual frequency. The accuracy is limited by the calibration step size, which can cause a frequency error even when CDFLL module 300 operates correctly. Such calibration may be suitable for applications where the frequency error should be as small as possible for a short period of time. Some examples of applications are asynchronous communication and measuring short times in the microsecond and millisecond range.

For other applications, the average frequency accuracy is more important than the instantaneous frequency accuracy. Some examples of applications are time keeping applications (e.g., real time clocks) and energy flow measurements. For example, coulomb counting in a battery management system measures current flow at regular intervals and accumulates the current flow measurements over a time period. The accumulated current flow measurements are multiplied by an accurate measurement of the time passed. The result is the amount of charge drawn from or delivered to the battery. Thus, for coulomb counting, the average frequency error over time may be more important than instantaneous frequency accuracy, especially if the current flow is relatively stable.

For applications that utilize the average frequency error, CDFLL module 300 selects a calibration value that is not optimal for the frequency accuracy to minimize the accumulated frequency error over time. As shown in FIG. 5A, a calibration value that is not optimal results in mismatch 502 between actual frequency 504 and ideal frequency 506. Mismatch 502 is due to calibration step size error.

As shown in FIG. 5B, by periodically selecting a calibration value that is not optimal for calibration and which results in mismatch 508, the accumulated error over a long period of time will average to almost zero. That is, the sum of mismatch 502 and mismatch 508 will approach zero as time approaches infinity.

Assume CDFLL module 300 tries to target an ideal frequency of 100.0 KHz, but due to calibration step size error, the actual frequency obtained is 100.5 KHz, resulting in a 0.5 KHz mismatch. This calibrated clock can be used to measure 100 seconds. This is done by counting 100*100*1000=10 million clock cycles. The time duration for this is 10,000,000/100,500=99.5 seconds. Therefore, the clock has is 0.5% inaccurate. CDFLL module 300 can improve this accuracy by tracking the accumulated mismatch between the target frequency and the actual frequency and using the accumulated mismatch to vary the calibration value for the target oscillator over time. For example, 8 calibration periods (assuming a 2% calibration step size) provides the following frequency errors:
3 calibration periods: 100.5 kHz;
1 calibration period: 98.5 kHz;
3 calibration periods: 100.5 kHz;
1 calibration period: 98.5 kHz.

In this example, the first 3 calibration runs produce +1.5 kHz of accumulated frequency error. The next calibration run produces −1.5 kHz of frequency error due to an adjustment to the calibration values to provide a negative offset error. This is repeated for the next 5 cycles. In this example, the accumulated frequency error averages to zero over the 8 calibration periods.

Counting clock cycles includes counting approximately 7.5 million clock cycles of 100.5 kHz and approximately 7,500,000/100,500+2,500,000/98,000=100 seconds which is the correct time. Note that the term "approximately" is used in this example because CDFLL module 300 is measuring, tracking and minimizing the error in clock period, not frequency. This will give a slight variation in the number of clocks for this example.

The simplified example above is for discussion purposes. In practice, the sequence will auto-adjust over time to adapt to the entire accumulated error. For example, the sequence could be 3, 1, 3, 1, 4, 1, 3, 1, 1 . . . . For each calibration period, the CDFLL can determine a calibration setting to minimize the accumulated frequency error.

Referring again to FIG. 2, the "check cycle ratio" in step 210 attempts to get the cycle ratios as close to ideal as possible with no regard to the frequency errors accumulated from previous calibrations. With error averaging, the accumulated error is taken into account. This can be done by storing the difference between the ideal count and the actual count. In a first calibration, there is no record of a difference. However, the CDFLL will have the values of the actual count and the ideal count, and the difference between these values can be calculated and stored in a data register. In a second and subsequent calibration, the CDFLL can calculate the ideal count and add the stored difference from the first calibration. This sum can be used as a new ideal value for the second calibration. Again, the difference between the actual count and this new ideal value can be calculated and stored, and used as input to a third calibration, and so on.

In some implementations, Equation [1] can be adjusted to account for the calibration step size error resulting from the first calibration as follows:

$$\text{Count} = \text{Base} \pm (\text{Temp} * \alpha) + \text{remaining count}. \qquad [2]$$

The term remaining count in Equation [2] represents the difference from the ideal count. By adding the remaining count to the next count computed in the next calibration run according to Equation [2], the accumulated frequency error will be transferred to the next calibration run and averaged out.

Figure 6:
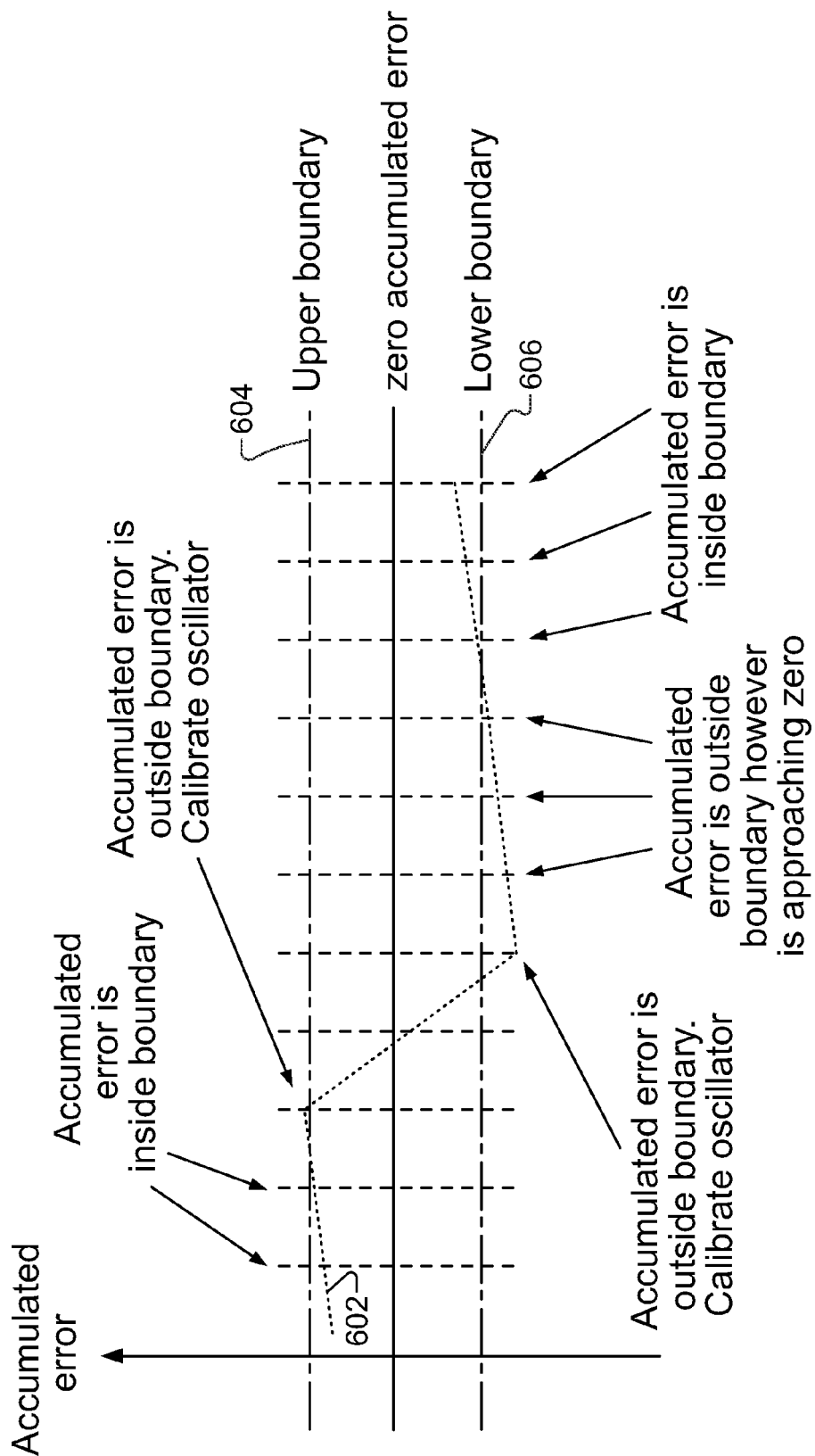
FIG. 6 is a graph further illustrating the process of averaging accumulated frequency error to almost zero.

FIG. 6 is a graph further illustrating the process of averaging accumulated frequency error to almost zero. With error averaging, the accumulated error 602 varies between two boundaries 604, 606. In some implementations, the target oscillator is not calibrated if accumulated error 602 is between boundaries 604, 606. Once accumulated error 602 crosses one of boundaries 604, 606, corrective actions can be taken (e.g., calibrate the target oscillator). In addition, if accumulated error 602 is outside one of boundaries 604, 606, and is moving towards zero compared to a previous value of accumulated error 602, no corrective actions need be taken (e.g., do not calibrate target oscillator), as accumulated error 602 is moving in the desired direction (i.e., towards zero accumulated error).

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A compensating digital frequency locked loop (CDFLL), comprising:
   a reference oscillator;
   a target oscillator; and
   circuitry configured to calculate during operation of the CDFLL a calibration value based on a temperature reading and characterization data, and to calibrate the target oscillator using the calibration value, where the calibration value is based on a corrected count calculated from a base period value and a temperature coefficient.

2. The CDFLL of claim 1, further comprising:
   an analog-to-digital converter coupled to the CDFLL and configured to provide the temperature reading during operation of the CDFLL.

3. The CDFLL of claim 2, where the temperature reading is provided at regular timer intervals.

4. The CDFLL of claim 1, where the calibration value is based on a comparison of a reference oscillator clock period and a target oscillator clock period.

5. The CDFLL of claim 4, where the comparison includes comparing a count of target oscillator clock cycles to a count of reference oscillator clock cycles.

6. The CDFLL of claim 1, where the corrected count is given by $$\text{Count}=\text{Base}+/-(\text{Temp}*\alpha),$$

where Base is the base period value, Temp is the temperature reading and $\alpha$ is the temperature coefficient.

7. A method of calibrating a digital frequency locked loop (DFLL), the method comprising:
performing a first calibration of a target oscillator frequency based on a reference oscillator frequency using a first calibration value; and
performing a second calibration of the target oscillator frequency based on the reference oscillator frequency using a second calibration value, where the second calibration value is based on a calibration step size error resulting from the first calibration, where the second calibration value is based on a corrected count calculated from a base period value and a temperature coefficient.

8. The method of claim 7, where performing the first and second calibration comprises:
calculating during operation of the DFLL the first or second calibration value based on a temperature reading and characterization data; and
calibrating the target oscillator using the first or second calibration value.

9. The method of claim 7, where the corrected count is given by $$\text{Count}=\text{Base}+/-(\text{Temp}*\alpha)+\text{remaining count},$$

where Base is the base period value, Temp is the temperature reading, $\alpha$ is the temperature coefficient and remaining count is a difference between the corrected count and an actual count.

* * * * *

UNITED STATES PATENT AND TRADEMARK OFFICE
CERTIFICATE OF CORRECTION

PATENT NO.         : 8,344,817 B2
APPLICATION NO.    : 12/976886
DATED              : January 1, 2013
INVENTOR(S)        : Arne Aas It is certified that error appears in the above-identified patent and that said Letters Patent is hereby corrected as shown below:

In Column 4, Line 40 of Issued Patent, delete "$R_i=+1.$" and insert -- $R_i=R_{i-1}+1.$ --, therefor.

Signed and Sealed this
Twenty-sixth Day of February, 2013

Teresa Stanek Rea
*Acting Director of the United States Patent and Trademark Office*